US012635306B2

(12) United States Patent
Yin et al.

(10) Patent No.: US 12,635,306 B2
(45) Date of Patent: May 19, 2026

(54) LIGHT-EMITTING DIODE, LIGHT-EMITTING DIODE PACKAGE, AND LIGHT-EMITTING DEVICE

(71) Applicant: TIANJIN SANAN OPTOELECTRONICS CO., LTD., Tianjin (CN)

(72) Inventors: Taotao Yin, Tianjin (CN); Jin Wang, Tianjin (CN); Huanshao Kuo, Tianjin (CN); Yu-Ren Peng, Tianjin (CN); Duxiang Wang, Tianjin (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 370 days.

(21) Appl. No.: 18/339,590

(22) Filed: Jun. 22, 2023

(65) Prior Publication Data

US 2024/0047618 A1 Feb. 8, 2024

(30) Foreign Application Priority Data

Aug. 3, 2022 (CN) .......................... 202210927219.0

(51) Int. Cl.
| | |
|---|---|
| *H01L 33/38* | (2010.01) |
| *H10H 20/01* | (2025.01) |
| *H10H 20/814* | (2025.01) |
| *H10H 20/82* | (2025.01) |
| *H10H 20/831* | (2025.01) |

(52) U.S. Cl.
CPC ...... *H10H 20/8314* (2025.01); *H10H 20/018* (2025.01); *H10H 20/814* (2025.01); *H10H 20/82* (2025.01)

(58) Field of Classification Search
CPC ............ H10H 20/8314; H10H 20/018; H10H 20/814; H10H 20/82; H10H 20/833; H10H 20/835; H10H 20/831; H10H 20/841; H10H 20/85; H10H 20/857
See application file for complete search history.

(56) References Cited

U.S. PATENT DOCUMENTS

2011/0227114 A1* 9/2011 Kim ..................... H10H 20/819
257/98
2011/0284822 A1* 11/2011 Jung .................... H10H 20/812
257/E33.012

(Continued)

*Primary Examiner* — Mohammed R Alam
(74) *Attorney, Agent, or Firm* — Muncy, Geissler, Olds & Lowe, P.C.

(57) ABSTRACT

A light-emitting diode includes a semiconductor epitaxy stack, a reflection layer, a first pad electrode, and a second pad electrode. The semiconductor epitaxy stack has a first surface and a second surface opposite to the first surface. The first surface has an electrode region and a light exit region. The semiconductor epitaxy stack includes a first type semiconductor layer, an active layer and a second type semiconductor layer that are arranged in such order in a direction from the first surface to the second surface. The reflection layer is disposed on the second surface opposite to the first surface. The first pad electrode is disposed on the electrode region and is electrically connected to the first type semiconductor layer. The second pad electrode is disposed on the electrode region and is electrically connected to the second type semiconductor layer.

20 Claims, 10 Drawing Sheets

(56)  References Cited

U.S. PATENT DOCUMENTS

2013/0043504 A1*   2/2013   Kobayakawa ..... H10H 20/8585
                                                257/E33.057
2013/0264600 A1*  10/2013   Lee ........................ H01L 24/83
                                                257/98
2022/0302346 A1*   9/2022   Hsieh ................... H10H 20/018

* cited by examiner

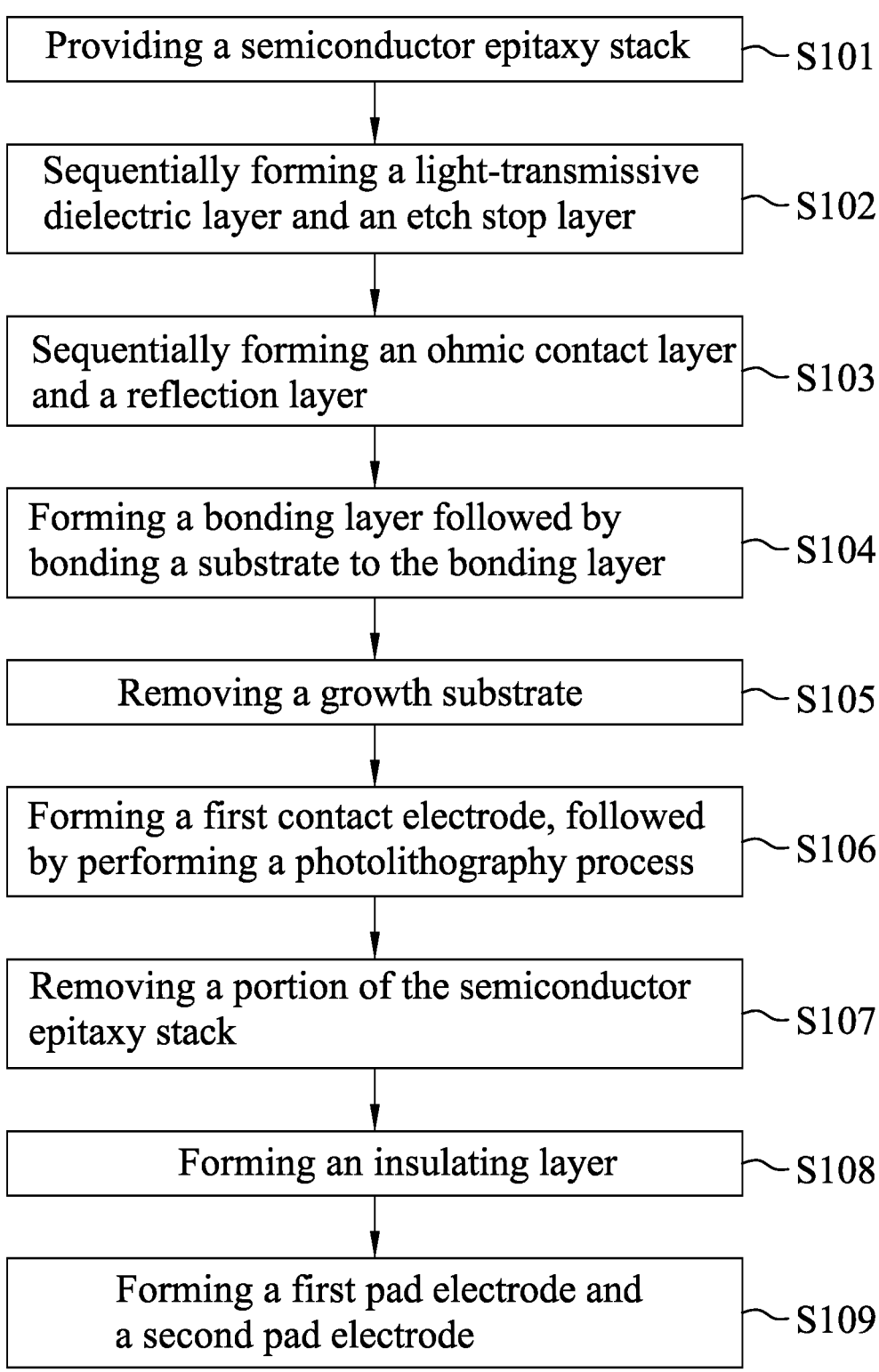

| Providing a semiconductor epitaxy stack | ~S101 |

| Sequentially forming a light-transmissive dielectric layer and an etch stop layer | ~S102 |

| Sequentially forming an ohmic contact layer and a reflection layer | ~S103 |

| Forming a bonding layer followed by bonding a substrate to the bonding layer | ~S104 |

| Removing a growth substrate | ~S105 |

| Forming a first contact electrode, followed by performing a photolithography process | ~S106 |

| Removing a portion of the semiconductor epitaxy stack | ~S107 |

| Forming an insulating layer | ~S108 |

| Forming a first pad electrode and a second pad electrode | ~S109 |

FIG.4

LIGHT-EMITTING DIODE, LIGHT-EMITTING DIODE PACKAGE, AND LIGHT-EMITTING DEVICE

CROSS-REFERENCE TO RELATED APPLICATION

This application claims priority of Chinese Invention Patent Application No. 202210927219.0, filed on Aug. 3, 2022.

FIELD

The disclosure relates to a semiconductor optoelectric device, and more particularly to a light-emitting diode, a light-emitting diode package, and a light-emitting device.

BACKGROUND

A light-emitting diode (LED) is regarded as one of the most promising light sources due to various advantages, such as high brightness, high luminous efficiency, small dimension, and long service life. In recent years, the LED has been widely applied in various fields, e.g., lighting, signal display, backlight, vehicle lamp, and large screen display. Since the LED has wide applications, there is a need to improve the brightness and the luminous efficiency of the LED.

At present, an infrared LED product (having an emission wavelength of 850 nm) has a vertical structure that includes a substrate, an epitaxial layer, a current blocking layer, and a reflection layer, where the substrate is made of silicon (Si), the epitaxial layer is made of a ternary material (e.g., aluminum gallium arsenide (AlGaAs)), and the reflection layer is made of silver (Ag). Such infrared LED product has a stable photoelectric performance and has been widely applied in various fields, such as remote control, sensor, or monitoring. However, the infrared LED product having the vertical structure may not meet packaging requirements (e.g., a p-type electrode and an n-type electrode of the infrared LED product are at the same side thereof) for specific products in some fields (e.g., head-mounted display).

SUMMARY

Therefore, an object of the disclosure is to provide a light-emitting diode (LED), an LED package, and a light-emitting device that can alleviate at least one of the drawbacks of the prior art.

According to a first aspect of the disclosure, an LED includes a semiconductor epitaxy stack, a reflection layer, a first pad electrode, and a second pad electrode.

The semiconductor epitaxy stack has a first surface and a second surface opposite to the first surface. The first surface has an electrode region and a light exit region. The semiconductor epitaxy stack includes a first type semiconductor layer, an active layer and a second type semiconductor layer that are arranged in such order in a direction from the first surface to the second surface.

The reflection layer is disposed on the second surface opposite to the first surface.

The first pad electrode is disposed on the electrode region and is electrically connected to the first type semiconductor layer.

The second pad electrode is disposed on the electrode region and is electrically connected to the second type semiconductor layer.

According to a second aspect of the disclosure, an LED package includes the abovementioned LED.

According to a third aspect of the disclosure, a light-emitting device includes the abovementioned LED.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

FIG. 4 is a flow chart illustrating consecutive steps of a method for manufacturing the second embodiment of the LED.

DETAILED DESCRIPTION

Figure 1:
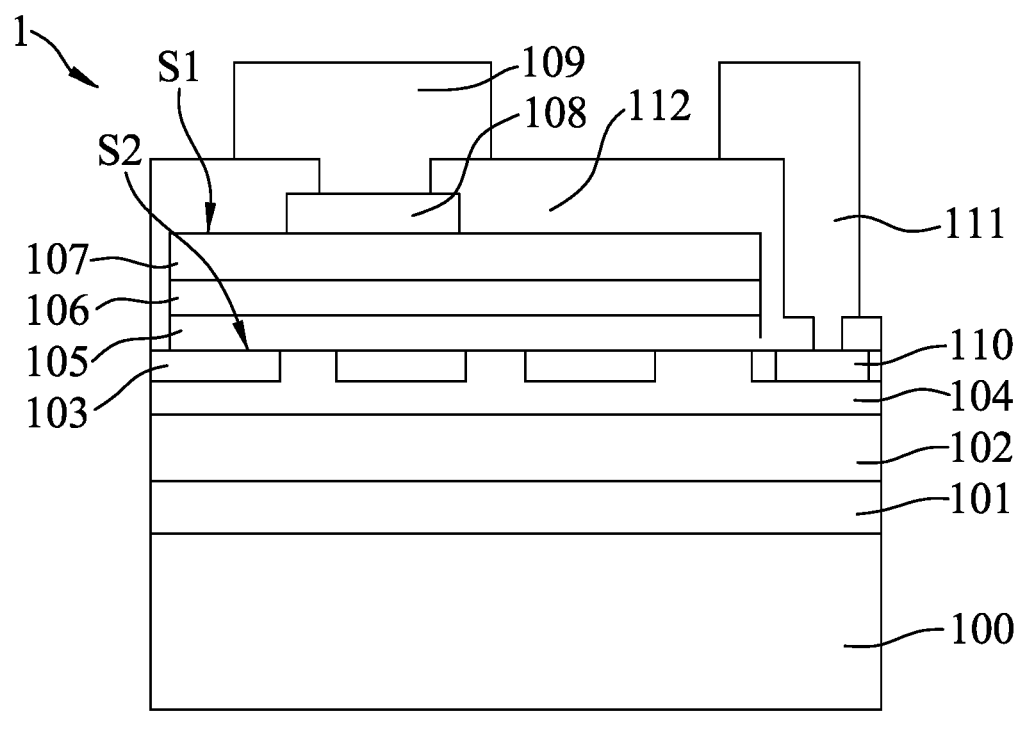
FIG. 1 is a schematic view illustrating a first embodiment of a light-emitting diode (LED) according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "upper," "on," "over," and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
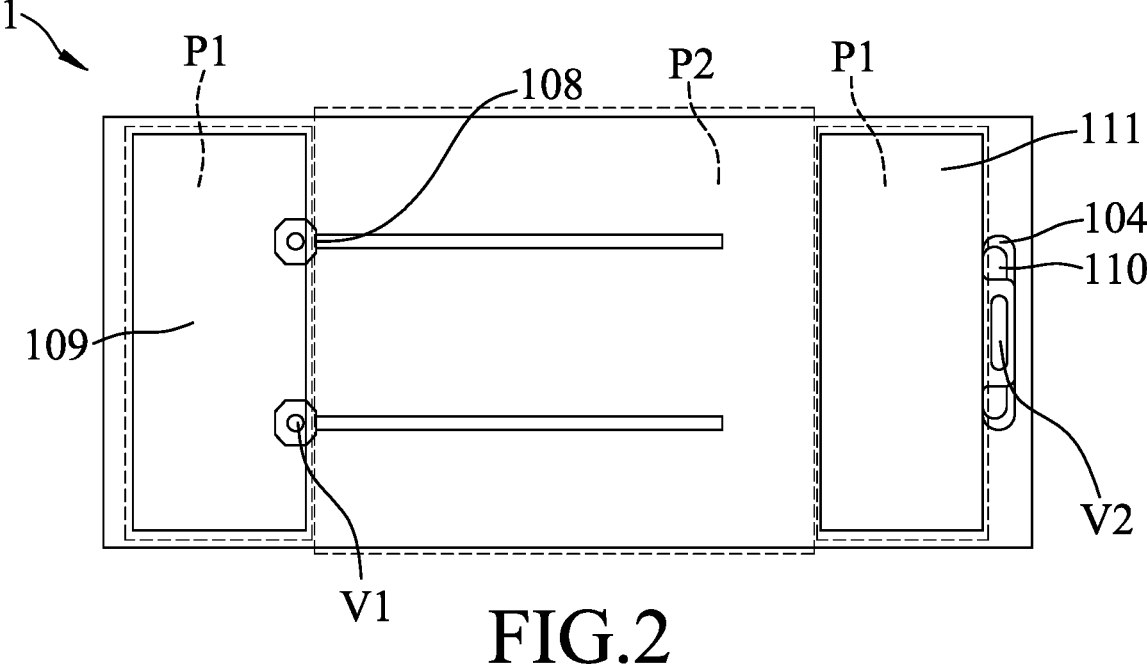
FIG. 2 is a schematic top view illustrating the first embodiment of the LED according to the disclosure.

Referring to FIGS. 1 and 2, a first embodiment of a light-emitting diode (LED) 1 according to the present disclosure includes, a substrate 100, a bonding layer 101, a reflection layer 102, a light-transmissive dielectric layer 103, an ohmic contact layer 104, a semiconductor epitaxy stack (including a second type semiconductor layer 105, an active layer 106, and a first type semiconductor layer 107), a first contact electrode 108, a first pad electrode 109, an etch stop layer 110, and a second pad electrode 111.

The substrate 100 may be a conductive substrate or a non-conductive substrate. In some embodiments, the conductive substrate may be one of a silicon substrate, a silicon carbide substrate, or a metallic substrate (e.g., a copper substrate, a tungsten substrate or a molybdenum substrate). In some embodiments, the non-conductive substrate may be made of an inorganic material (e.g., sapphire, lithium aluminate, zinc oxide, glass, or quartz) or a group III-V semiconductor material (e.g., indium phosphide, gallium phosphide, gallium nitride, or aluminum nitride). In this embodiment, the substrate 100 is a silicon substrate. In alternative embodiments, the substrate 100 may be a transparent sapphire substrate.

The bonding layer 101 is disposed between the substrate 100 and the semiconductor epitaxy stack, and is used to bond the semiconductor epitaxy stack to the substrate 100. In some embodiments, the bonding layer 101 may be made of a metal, for example, but not limited to, gold (Au), indium (In), tin (Sn), titanium (Ti), nickel (Ni), or platinum (Pt). In alternative embodiments, the bonding layer 101 may be made of an insulating material, for example, but not limited to, polyimide (PI), benzocyclobutene (BCB), perfluorocyclobutyl (PFOB), magnesium oxide (MgO), epoxy, acrylic resin, copolymer of cycloolefin (COC), poly(methyl methacrylate) (PMMA), polyethylene terephthalate (PET), polycarbonate (PC), polyetherimide, fluorocarbon polymer, glass, aluminum oxide ($Al_2O_3$), silicon oxide ($SiO_x$), titanium oxide ($TiO_2$), tantalum oxide ($Ta_2O_5$), silicon nitride ($SiN_x$), or spin on glass (SOG). The bonding layer 101 may be formed as a single layer structure or a multi-layered structure. The bonding layer 101 may be made of different materials.

In some embodiments, when the substrate 100 is a conductive substrate and the bonding layer 101 is made of a metal, the LED 1 may further include an insulating layer (not shown) disposed on a back surface of the substrate 100 opposite to the bonding layer 101 or between the substrate 100 and the bonding layer 101. In such case, the insulating layer may be made of magnesium fluoride ($MgF_2$), so as to achieve insulation and protection the LED 1.

The reflection layer 102 is disposed between the bonding layer 101 and the semiconductor epitaxy stack. The reflection layer 102 may have a reflectance greater than 70%, and may be made of one of a metal (e.g., silver (Ag), nickel (Ni), aluminum (Al), rhodium (Rh), palladium (Pd), iridium (Ir), ruthenium (Ru), magnesium (Mg), zinc (Zn), platinum (Pt), gold (Au), hafnium (Hf), or combinations thereof), an alloy, and a distributed Bragg reflector (DBR). The DBR may include plural sets of two materials that are alternately stacked and that have different reflectances. In this embodiment, the reflection layer 102 is made of silver (Ag). The reflection layer 102 is capable of reflecting light emitted from the semiconductor epitaxy stack (the active layer 106) and toward the substrate 100 back to the semiconductor epitaxy stack, so that the reflected light may transmit through a light exit side of the LED 1. The light exit side of the LED 1 is located at a side of the first type semiconductor layer 107 that is distal from the active layer 106.

The light-transmissive dielectric layer 103 is disposed between the second type semiconductor layer 105 and the reflection layer 102, and is used to provide an ohmic contact for the semiconductor epitaxy stack. The light-transmissive dielectric layer 103 may be made of an insulating material having a high resistance, such as oxide (e.g., zinc oxide (ZnO), silicon dioxide ($SiO_2$), silicon oxide ($SiO_x$), aluminum oxide ($Al_2O_3$), or titanium oxide ($TiO_x$)), nitride (e.g., silicon oxynitride ($SiO_xN_y$) or silicon nitride ($Si_3N_4$)), fluoride (e.g., magnesium fluoride ($MgF_2$) or gallium fluoride ($GaF_2$)), or combinations thereof. The light-transmissive dielectric layer 103 is disposed on a side of the second type semiconductor layer 105 that is distal from the active layer 106, and is used to reflect light emitted from the active layer 106 back to the semiconductor epitaxy stack or back to a side of the LED 1. The light-transmissive dielectric layer 103 may be made of a low refractive index material, which is conducive to increasing a reflection rate of light emitted from the active layer 106 and transmitted to a surface of the light-transmissive dielectric layer 103. In some embodiments, the low refractive index material may be silicon oxide (the refractive index thereof is not larger than 1.5) or magnesium fluoride ($MgF_2$). The light-transmissive dielectric layer 103 may have a thickness not less than 100 nm, such as from 100 nm to 500 nm, from 100 nm to 400 nm, or from 150 nm to 400 nm. The light-transmissive dielectric layer 103 may have a transmittance not less than 70%, such as not less than 80% or 90%.

The light-transmissive dielectric layer 103 may include a plurality of through holes (not shown), each of which penetrates through the light-transmissive dielectric layer 103. The through hole may have a horizontal cross-section that has a circular shape, an elliptic shape, or a polygon shape. The light-transmissive dielectric layer 103 may have a width ranging from 2 μm to 10 μm in a horizontal direction.

The ohmic contact layer 104 is disposed between the reflection layer 102 and the light-transmissive dielectric layer 103, and fills at least a portion of each of the through holes of the light-transmissive dielectric layer 103. In some embodiments, the ohmic contact layer 104 may extend through the through holes to contact the semiconductor epitaxy stack. The ohmic contact layer 104 may be a transparent conducting layer or a conductive metal layer. The ohmic contact layer 104 may be made of indium tin oxide (ITO), indium zinc oxide (IZO), or alloy (e.g., gold-zinc, gold-germanium, nickel-gold, gold-germanium-nickel, or gold-beryllium). In this embodiment, the ohmic contact layer 104 is made of ITO.

The reflection layer 102 and the light-transmissive dielectric layer 103 may cooperate to form an omni-directional reflection (ODR) structure, so as to reflect light emitted from the active layer 106 of the semiconductor epitaxy stack and toward the substrate 100 back to the semiconductor epitaxy stack and transmitted through the light exit side of the LED 1, and to further enhance a luminous efficiency of the LED 1.

The semiconductor epitaxy stack is disposed on the light-transmissive dielectric layer 103 and the ohmic contact layer 104 opposite to the substrate 100. The semiconductor epitaxy stack has a first surface S1 and a second surface S2 opposite to the first surface S1. The first surface S1 has an electrode region P1 and a light exit region P2. As shown in FIG. 1, the semiconductor epitaxy stack includes the first type semiconductor layer 107, the active layer 106 and the second type semiconductor layer 105 that are arranged in such order in a direction from the first surface S1 to the second surface S2. One of the first type semiconductor layer 107 and the second type semiconductor layer 105 may provide electrons by doping with an n-type dopant, and the other one of the first type semiconductor layer 107 and the second type semiconductor layer 105 may provide holes by doping with a p-type dopant. The n-type dopant may be silicon (Si), germanium (Ge), or tin (Sn), and the p-type dopant may be magnesium (Mg), zinc (Zn), calcium (Ca), strontium (Sr), or barium (Ba). The first type semiconductor layer 107 or the second type semiconductor layer 105 may include a cap sublayer (not shown) that can provide electrons or holes, a current spreading sublayer (not shown), a window sublayer (not shown), or an ohmic contact sublayer (not shown). The first type semiconductor layer 107 or the second type semiconductor layer 105 may be formed as a multi-layered structure, and different layers of the multi-layered structure have different doping concentrations or compositions. The active layer 106 is an area in which electrons and holes may combine to emit light. The material for forming the active layer 106 may depend on a desired emission wavelength of light. In some embodiments, the active layer 106 may be formed as a single quantum well structure or a periodic structure (e.g., a multiple quantum well structure). By adjusting a composition ratio of the material for the active layer 106, the active layer 106 may emit light having different emission wavelengths. The semiconductor epitaxy stack may be made of aluminum gallium arsenide (AlGaAs)-based material or aluminum gallium indium phosphide (AlGaInP)-based material, and the emission wavelength of the active layer 106 may range from 550 nm to 950 nm. In this embodiment, the first type semiconductor layer 107 is an n-type semiconductor layer, the second type semiconductor layer 105 is a p-type semiconductor layer, and light emitted from the active layer 106 is infrared light.

In order to arrange the first pad electrode 109 and the second pad electrode 111 on a same side of the semiconductor epitaxy stack, a portion of one of the first type semiconductor layer 107 and the second type semiconductor layer 105 may be exposed from the other one of the first type semiconductor layer 107 and the second type semiconductor layer 105. For example, as shown in FIG. 1, the semiconductor epitaxy stack includes a recessed region and a platform region adjacent to the recessed region. The recessed region is formed by removing a portion of the semiconductor epitaxy stack (i.e., a portion of the first type semiconductor layer 107, a portion of the active layer 106 and a portion of the second type semiconductor layer 105). The remaining portion of the semiconductor epitaxy stack is defined as the platform region. The platform region may protrude relative to the recessed region along a growth direction of the semiconductor epitaxy stack. The recessed region may be referred to as an etched region. In this embodiment, in the recessed region, the semiconductor epitaxy stack is fully removed. In alternative embodiments, the first type semiconductor layer 107 and the active layer 106 are fully removed, and the second type semiconductor layer 105 are not removed in the recessed region.

The first contact electrode 108 is disposed on the first type semiconductor layer 107, and is electrically connected to the first type semiconductor layer 107 in a direct or an indirect manner. The first contact electrode 108 is disposed between the first pad electrode 109 and the first type semiconductor layer 107, and extends from the electrode region P1 onto the light exit region P2. The etch stop layer 110 is disposed on the ohmic contact layer 104, and is electrically connected to the second type semiconductor layer 105 in a direct or an indirect manner. In this embodiment, the etch stop layer 110 is disposed in the light-transmissive dielectric layer 103, and may be referred to as a second contact electrode V2 (see FIG. 2). When a conductivity type of the first type semiconductor layer 107 is n-type, the first contact electrode 108 is referred to as a contact electrode at an n-side of the LED 1. When the conductivity type of the first type semiconductor layer 107 is p-type, the first contact electrode 108 is referred to as a contact electrode at a p-side of the LED 1. When the first contact electrode 108 is referred to as the contact electrode at the n-side of the LED 1, the etch stop layer 110 is referred to as the contact electrode at the p-side of the LED 1, and vice versa. In this embodiment, the first contact electrode 108 is the contact electrode at the n-side of the LED 1. The first contact electrode 108 may be made of one of nickel (Ni), gold (Au), chromium (Cr), titanium (Ti), platinum (Pt), palladium (Pd), rhodium (Rh), iridium (Ir), aluminum (Al), tin (Sn), indium (In), tantalum (Ta), copper (Cu), cobalt (Co), iron (Fe), ruthenium (Ru), zirconium (Zr), tungsten (W), molybdenum (Mo), germanium (Ge), or combinations thereof. In this embodiment, the first contact electrode 108 is made of gold-germanium (AuGe) or gold-germanium-nickel (AuGeNi). In some embodiments, as shown in FIG. 2, a portion of the first contact electrode 108 are in direct contact with the first pad electrode 109 in a region V1.

In this embodiment, the semiconductor epitaxy stack is made of AlGaAs, and emits infrared light. In a conventional LED, a current spreading layer made of gallium phosphide (GaP) has a lattice mismatch with the semiconductor epitaxy stack made of AlGaAs and is relatively thinner (thickness ranging from 300 Å to 1000 Å). Such current spreading layer may not be able to achieve an efficient current conduction in the conventional LED. Therefore, in this embodiment, by fully removing the semiconductor epitaxy stack in the recessed region and by forming the second pad electrode 111 on the recessed region, a current from the second pad electrode 111 may spread through the ohmic contact layer 104 and the reflection layer 102. In order to prevent the reflection layer 102 from being damaged during removal process of the semiconductor epitaxy stack in the recessed region, the etch stop layer 110 is formed between the second pad electrode 111 and the ohmic contact layer 104. The etch stop layer 110 may be made of one of platinum (Pt), titanium (Ti), nickel (Ni), chromium (Cr), gold (Au), and combinations thereof. In this embodiment, the etch stop layer 110 is a laminate including a chromium (Cr) layer and a gold (Au) layer. The etch stop layer 110 may have a thickness ranging from 1000 Å to 5000 Å, such as not less than 2000 Å or ranging from 3000 Å to 5000 Å. With the provision that the etch stop layer 110 has a certain thickness, the reflection layer 102 may be prevented from being damaged during the removal process of the semiconductor epitaxy stack in the recessed region, so as to ensure that the reflectance of the reflection layer 102 may not be adversely affected and the luminous efficiency of the LED 1 may be enhanced.

The LED 1 may further include an insulating layer 112 covering an upper surface (i.e., the first surface S1) and a side surface of the semiconductor epitaxy stack, a portion of the first contact electrode 108, and a portion of the etch stop layer 110. The first pad electrode 109 and the second pad electrode 111 may be insulated from each other through the insulating layer 112, so as to protect the LED 1 from being adversely affected by water vapor, and to enhance reliability of the LED 1.

The first pad electrode 109 and the second pad electrode 111 are disposed on the insulating layer 112. The first pad electrode 109 and the second pad electrode 111 are located at the electrode region P1 (see FIG. 2). The insulating layer 112 may have at least one opening. There are no limitations on the shape or number of the opening of the insulating layer 112. The insulating layer 112 may have a single opening or a plurality of the openings. When the insulating layer 112 has the plurality of the openings, a current may be evenly distributed in the LED 1. In such case, the openings of the insulating layer 112 may be equally or not equally spaced apart from one another. In this embodiment, the insulating layer 112 has a first opening and a second opening that are spaced apart from each other. The first pad electrode 109 may pass through the first opening of the insulating layer 112 to be electrically connected to the first contact electrode 108. The second pad electrode 111 may pass through the second opening of the insulating layer 112 to be electrically connected to the etch stop layer 110. In some embodiments, a cross section of each of the first opening and the second opening may have a circular shape. In alternative embodiments, the cross section of each of the first opening and the second opening may have a rectangular shape or an elliptic shape. In some embodiments, each of the first pad electrode 109 and the second pad electrode 111 may be made of a material selected from the group consisting of Ti, Al, Pt, Au, Ni, Sn, alloys thereof, and laminates thereof. A total area of projections of the first pad electrode 109 and the second pad electrode 111 on an imaginary plane parallel to the second surface S2 may occupy 15% to 50% of an area of a projection of the LED 1 on the imaginary plane, such as not larger than 25% or not larger than 45%, so as to ensure that the electrode region P1 of the LED 1 may have enough area to be utilized in subsequent packaging process, and brightness of the LED 1 may not be adversely affected. In this embodiment, the second pad electrode 111 is electrically connected to the second type semiconductor layer 105 through the etch stop layer 110 and the ohmic contact layer 104.

An upper surface of the first pad electrode 109 may be flush with an upper surface of the second pad electrode 111. In such case, the first pad electrode 109 and the second pad electrode 111 may be fixed on a flexible transparent circuit board through eutectic soldering, so as to realize application of the LED 1 in some fields (e.g., head-mounted display).

Figure 3:
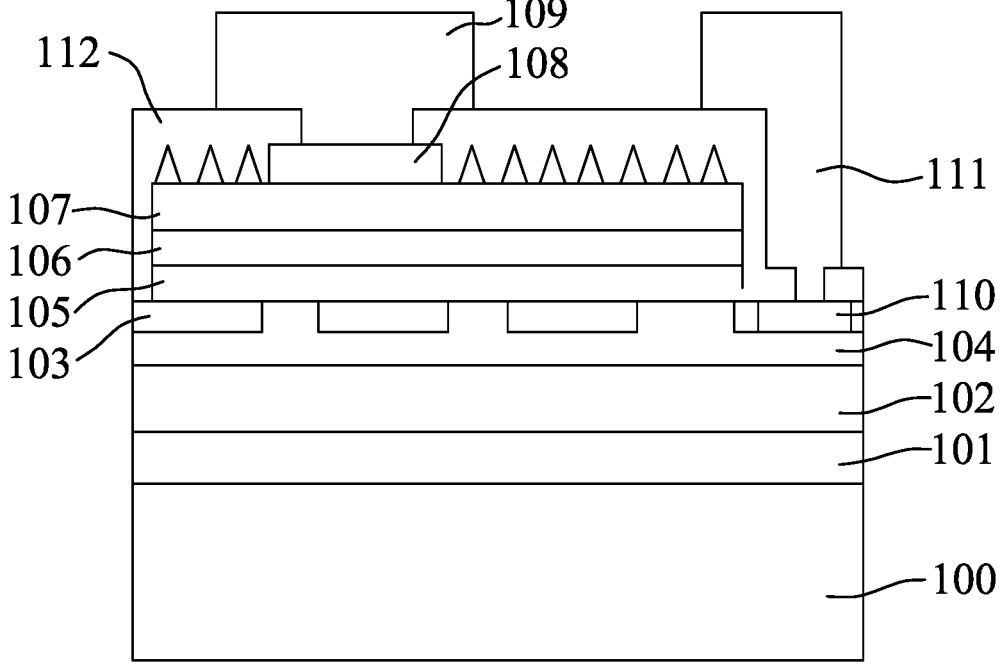
FIG. 3 is a schematic view illustrating a second embodiment of an LED according to the disclosure.

Referring to FIG. 3, a second embodiment of an LED according to the present disclosure is generally similar to the first embodiment, except that, in the second embodiment, an upper surface (i.e., the first surface S1 of the semiconductor epitaxy stack) of the first type semiconductor layer 107 that is exposed from the first contact electrode 108 and that faces away from the active layer 106 is a roughened surface. In this embodiment, by having the roughened upper surface, an amount of light emitted from the LED may be increased and the luminous efficiency of the LED may be enhanced.

Referring to FIG. 4, this disclosure also provides a method for manufacturing the second embodiment of the LED according to the present disclosure, which includes the following consecutive steps S101 to S109. FIGS. 5 to 12 illustrate intermediate stages of the method for manufacturing the second embodiment of the LED.

Figure 5:
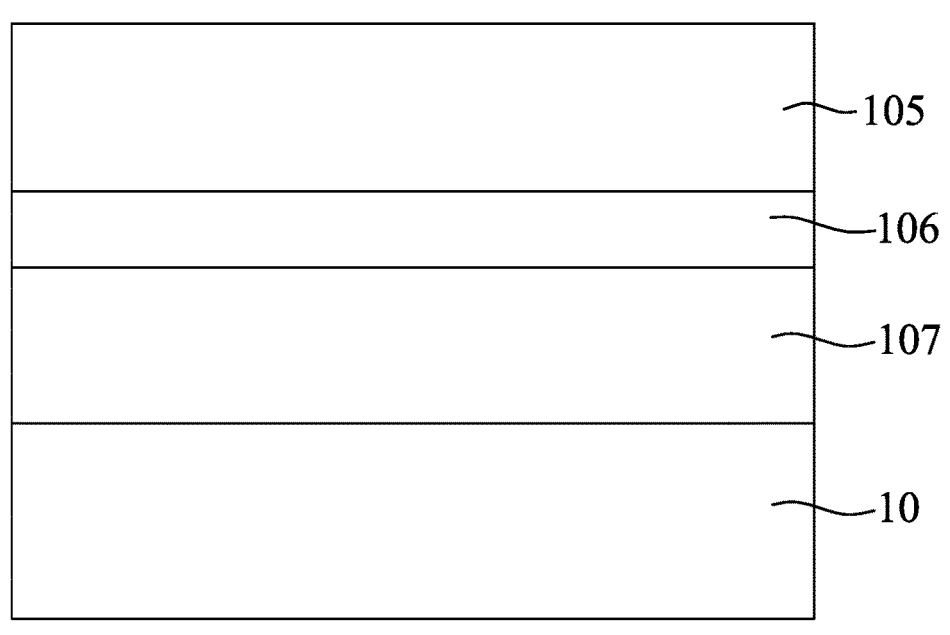
FIGS. 5 to 12 are schematic views illustrating some intermediate stages of the method as depicted in FIG. 4.

In step S101, as shown in FIG. 5, the semiconductor epitaxy stack is provided.

In this step, the semiconductor epitaxy stack is grown on a growth substrate 10 (e.g., a gallium arsenide substrate) using an epitaxial growth technique (e.g., metal-organic chemical vapor deposition (MOCVD)). During the growth of the semiconductor epitaxy stack, the first type semiconductor layer 107, the active layer 106, and the second type semiconductor layer 105 are sequentially grown on the growth substrate 10.

Figure 6:
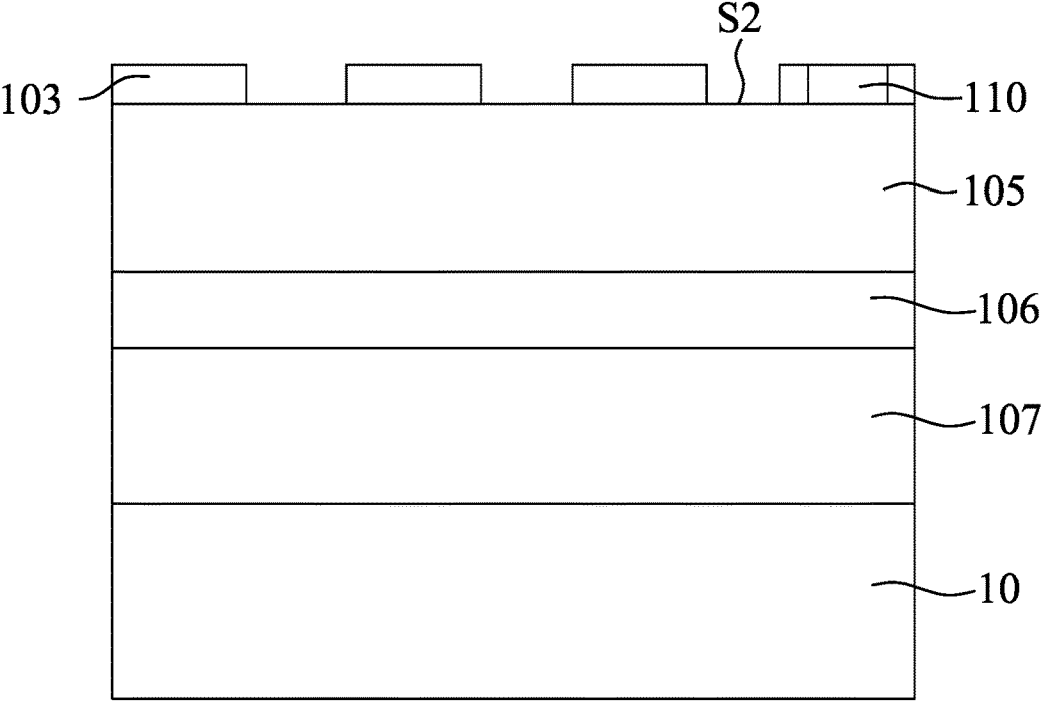

In step S102, as shown in FIG. 6, the light-transmissive dielectric layer 103 is formed on a side of the second type semiconductor layer 105 that is distal from the active layer 106. Through photolithography process, which uses a mask and an etching technique, the light-transmissive dielectric layer 103 is formed with the through holes to expose the second surface S2 of the semiconductor epitaxy stack. In this step, after formation of the light-transmissive dielectric layer 103, the etch stop layer 110 is formed on the second surface S2 of the semiconductor epitaxy stack and is disposed in the light-transmissive dielectric layer 103 through photolithography process.

Figure 7:
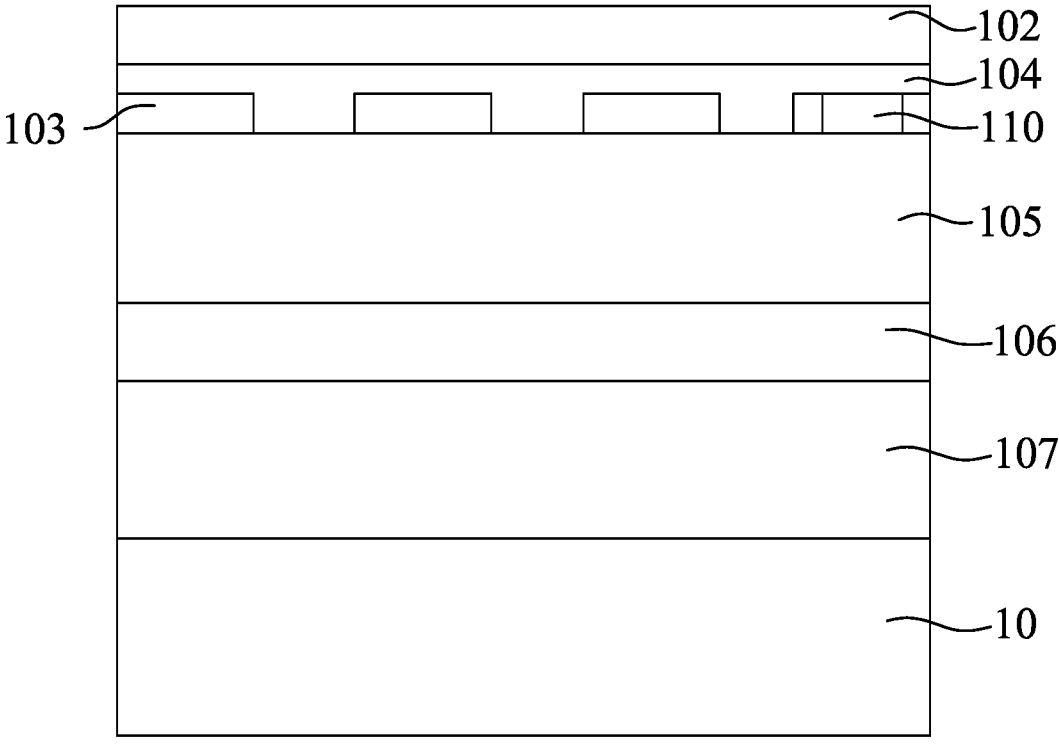

In step S103, as shown in FIG. 7, the ohmic contact layer 104 and the reflection layer 102 are sequentially formed on the structure shown in FIG. 6. The ohmic contact layer 104 is formed in the through holes of the light-transmissive dielectric layer 103 and on the etch stop layer 110.

After formation of the ohmic contact layer 104, the reflection layer 102 is formed on the ohmic contact layer 104 opposite to the light-transmissive dielectric layer 103.

Figure 8:
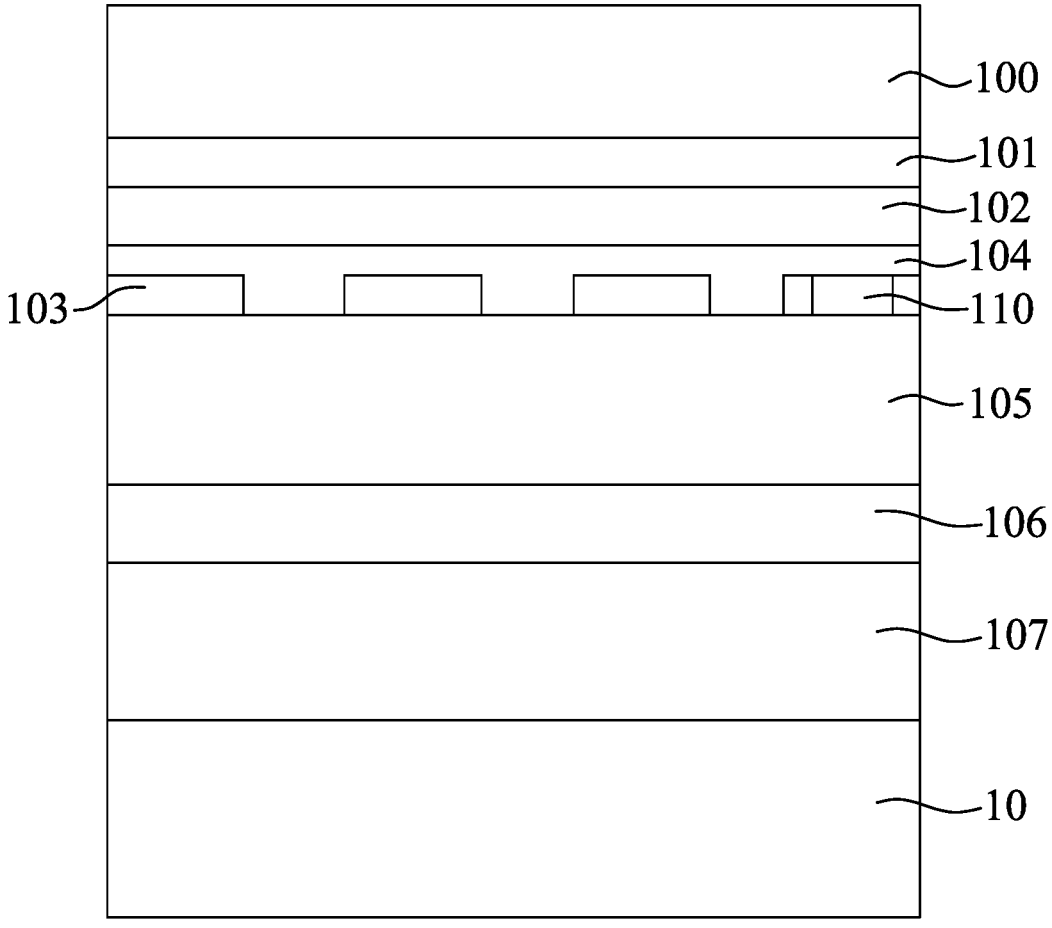

In step 104, as shown in FIG. 8, the bonding layer 101 is formed on the reflection layer 102 opposite to the ohmic contact layer 104, followed by bonding the substrate 100 to the bonding layer 101 using a bonding technique.

Figure 9:
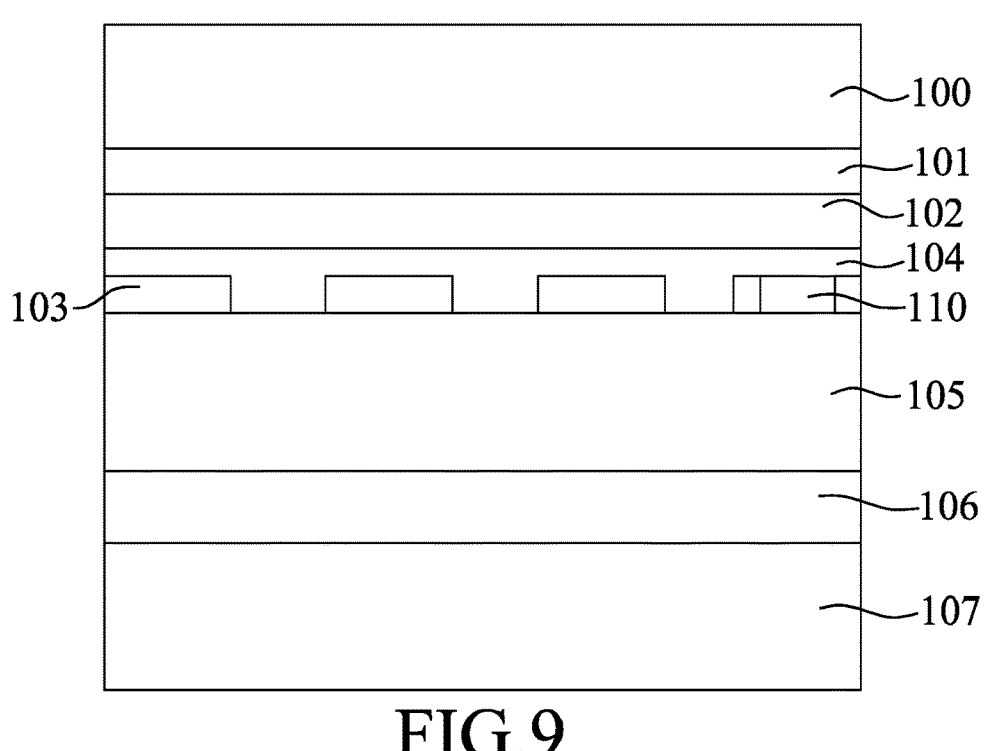

In step S105, as shown in FIG. 9, the growth substrate 10 is removed by wet etching.

Figure 10:
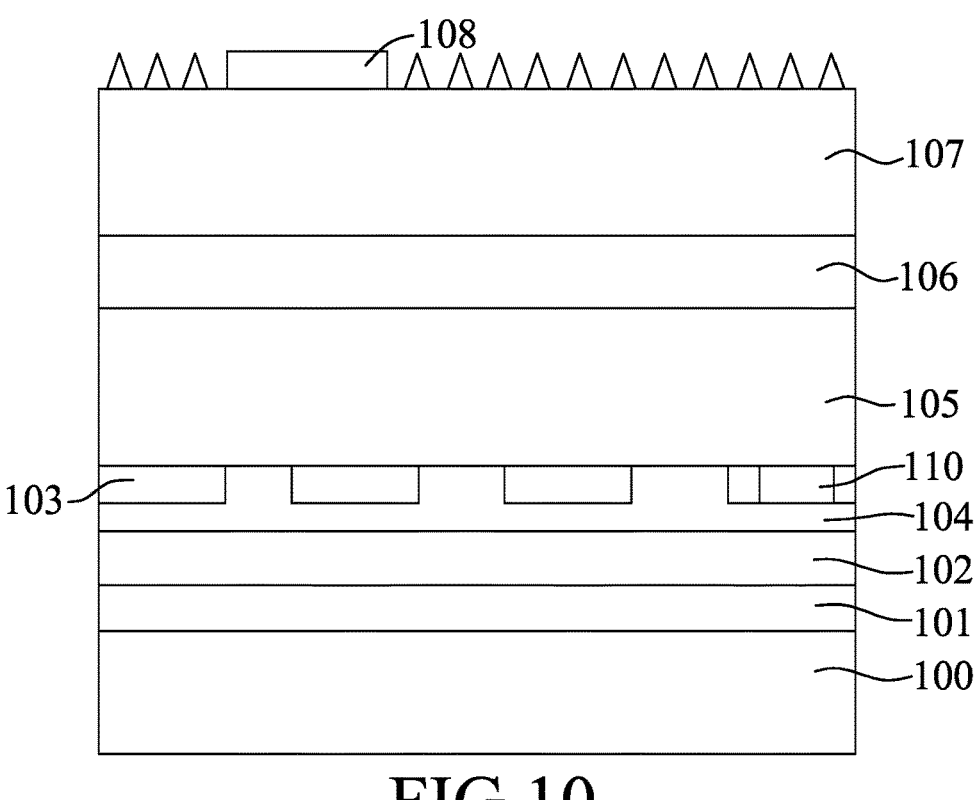

In step S106, as shown in FIG. 10, the first contact electrode 108 is formed on a portion of the first type semiconductor layer 107 opposite to the active layer 106. An upper surface of the remaining portion of the first type semiconductor layer 107 is exposed from the first contact electrode 108. In this step, after formation of the first contact electrode 108, a mask layer (not shown) is formed on the first contact electrode 108, followed by treating the upper surface of the remaining portion of the first type semiconductor layer 107 using an etching technique, so that the upper surface of the remaining portion of the first type semiconductor layer 107 is formed with a pattern or is formed into a roughened surface. In such case, the etching technique may be a wet etching technique, and a solution used in the wet etching technique may be an acidic solution, such as, hydrochloric acid, sulfuric acid, hydrofluoric acid, citric acid, or other suitable chemical agents.

Figure 11:
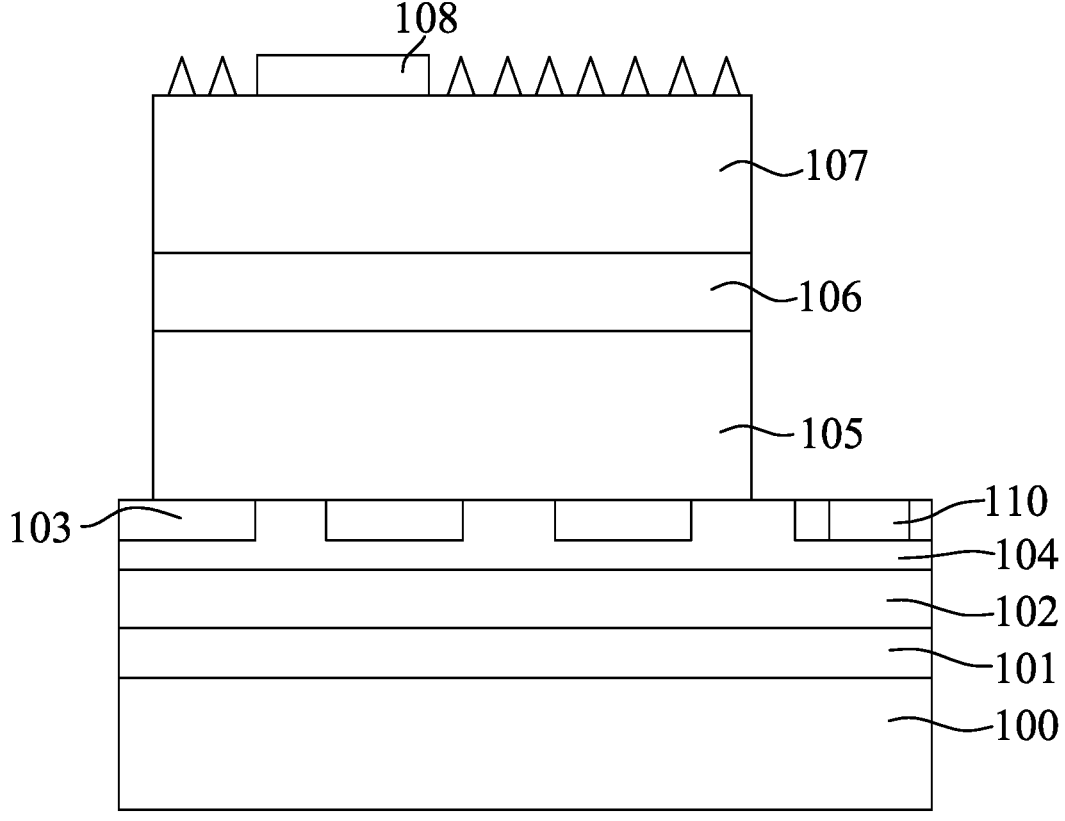

In step S107, as shown in FIG. 11, a patterned photoresist layer (not shown) is formed on the semiconductor epitaxy stack, and a portion of the semiconductor epitaxy stack (including a portion of the first type semiconductor layer 107, a portion of the active layer 106, and a portion of the second type semiconductor layer 105) is then removed until the etch stop layer 110 is exposed. After removal of the portion of the semiconductor epitaxy stack, the patterned photoresist layer is removed.

Figure 12:
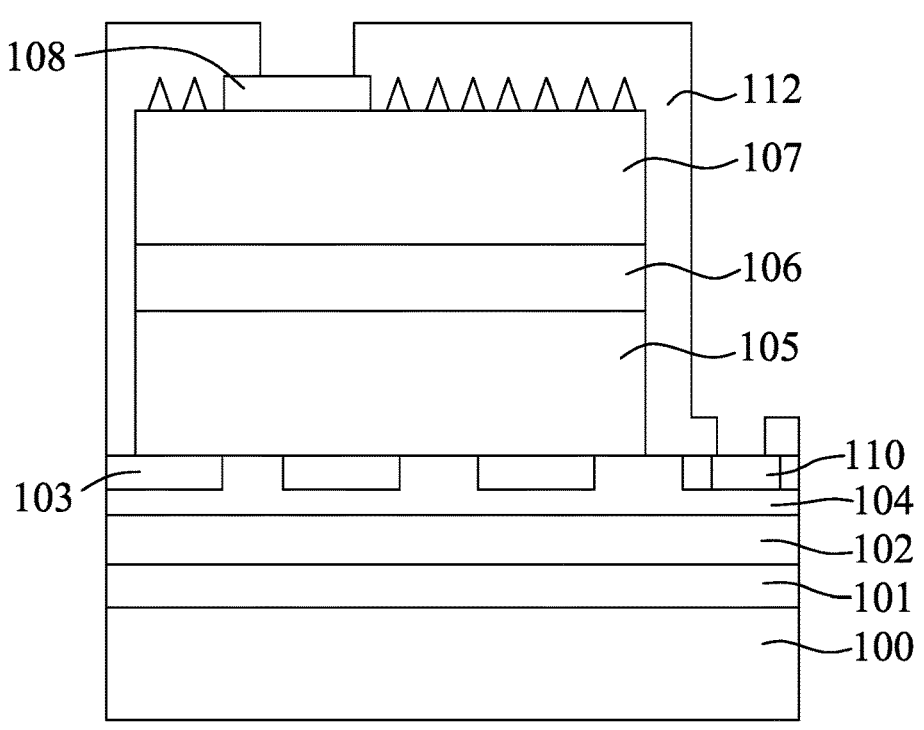

In step S108, as shown in FIG. 12, the insulating layer 112 is deposited on the structure shown in FIG. 11 to fully cover the upper surface and the side surface of the semiconductor epitaxy stack.

In step S109, the first pad electrode 109 and the second pad electrode 111 are formed. In this step, the first opening and the second opening are firstly formed, where the first opening penetrates through the insulating layer 112 on the first type semiconductor layer 107, and the second opening penetrates through the insulating layer 112 on the etch stop layer 110. After formation of the first opening and the second opening, the first pad electrode 109 and the second pad electrode 111 are formed. The first pad electrode 109 passes through the first opening to be electrically connected to the first type semiconductor layer 107, and the second pad electrode 111 passes through the second opening to be electrically connected to the second type semiconductor layer 105. After this step, the LED is therefore obtained.

In this embodiment, the LED has a horizontal structure, which can be applied in specific products in some fields (e.g., head-mounted display) through horizontal soldering.

Figure 13:
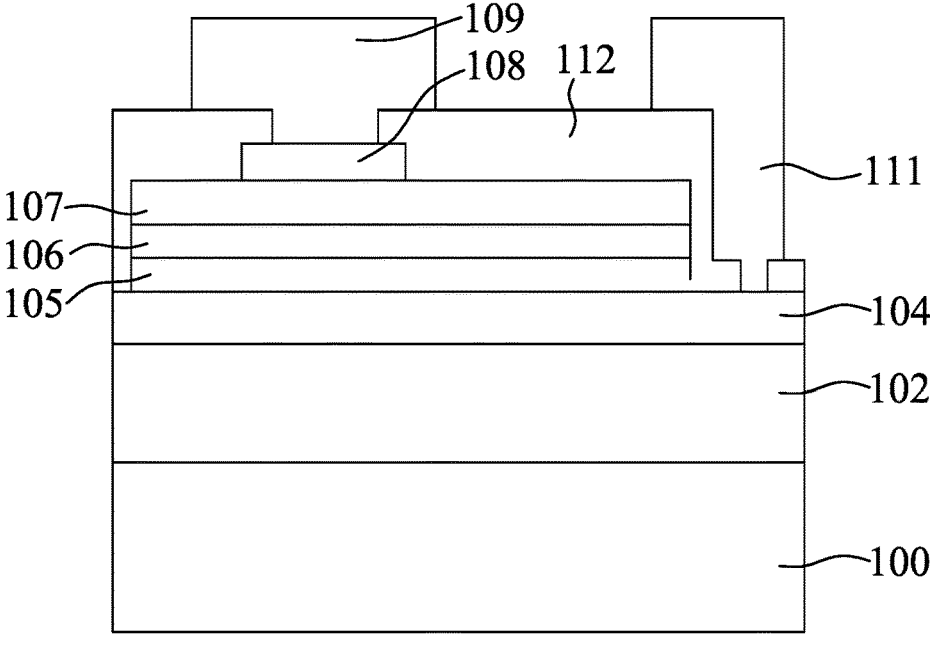
FIG. 13 is a schematic view illustrating a third embodiment of an LED according to the disclosure.

Referring to FIG. 13, a third embodiment of an LED according to the present disclosure is generally similar to the first embodiment, except that, in the third embodiment, the LED does not include the light-transmissive dielectric layer 103, and the second pad electrode 111 is in direct contact with the ohmic contact layer 104 and is electrically connected to the second type semiconductor layer 105 through the ohmic contact layer 104. In this embodiment, the substrate 100 is a growth substrate, and the reflection layer 102 is a DBR. In addition, the LED may be mounted on a flexible circuit board through soldering.

Figure 14:
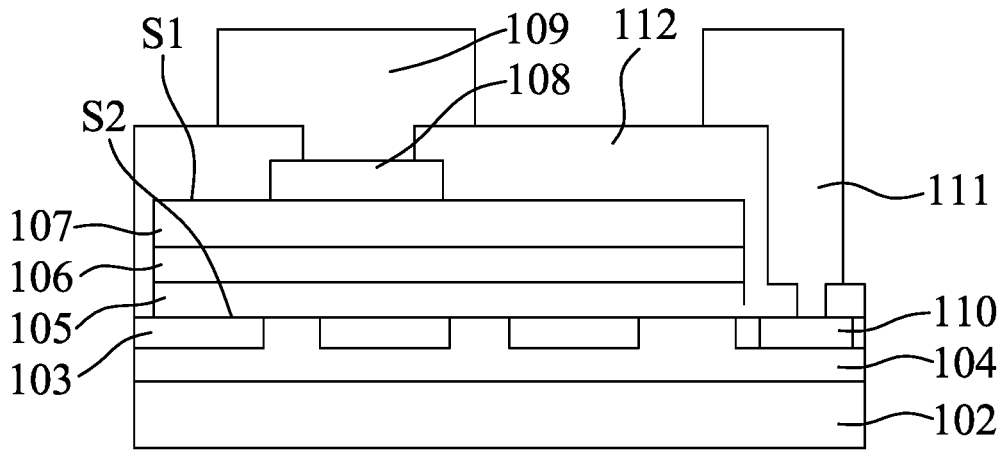
FIG. 14 is a schematic view illustrating a fourth embodiment of an LED according to the disclosure.

Referring to FIG. 14, a fourth embodiment of an LED according to the present disclosure is generally similar to the first embodiment, except that, in the fourth embodiment, the LED does not include the substrate 100 and the bonding layer 101. In this embodiment, the LED has a small size, such as not greater than 300 μm.

Figure 15:
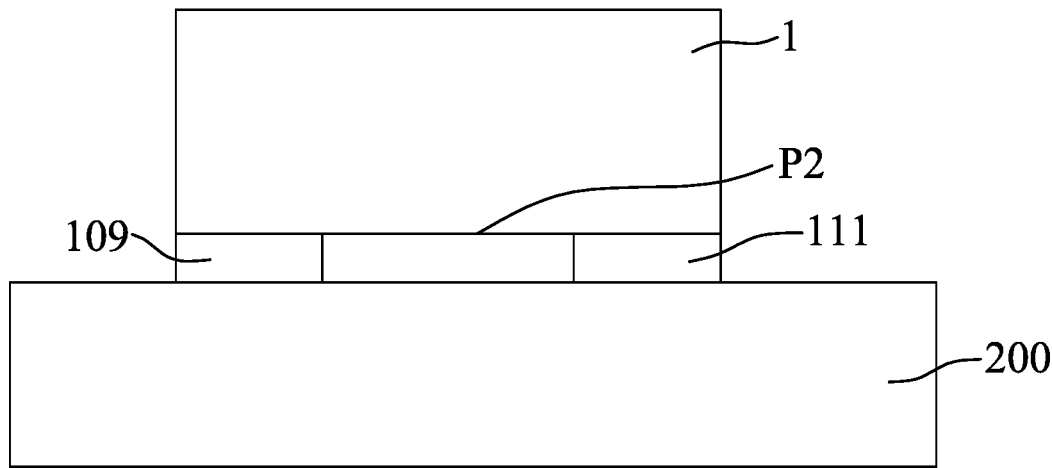
FIG. 15 is a schematic view illustrating a light-emitting diode package according to the disclosure.

Referring to FIG. 15, this disclosure also provides a light-emitting diode package which includes a mounting substrate 200 and the LED 1 as mentioned above. The LED 1 is mounted on the mounting substrate 200 through soldering. In this embodiment, the first pad electrode 109 and the second pad electrode 111 may be connected to the mounting substrate 200 through soldering. The mounting substrate 200 is light-transmissive and is a flexible circuit board. A light exit surface of the LED 1, the first pad electrode 109, and the second pad electrode 111 are located at the same side. The light exit region P2 of the LED 1 is located between the first pad electrode 109 and the second pad electrode 111.

This disclosure also provides a light-emitting device which includes the LED 1 as mentioned above. The light-emitting device may serve as a light source of the head-mounted display for tracking a human eye, which is adaptable for use in various fields, such as virtual reality (VR), augmented reality (AR), or mixed reality (MR).

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting diode, comprising:
a semiconductor epitaxy stack having a first surface and a second surface opposite to said first surface, said first surface having an electrode region and a light exit region, said semiconductor epitaxy stack including a first type semiconductor layer, an active layer and a second type semiconductor layer that are arranged in such order in a direction from said first surface to said second surface;
a reflection layer disposed on said second surface opposite to said first surface;
a first pad electrode disposed on said electrode region and electrically connected to said first type semiconductor layer; and
a second pad electrode disposed on said electrode region and electrically connected to said second type semiconductor layer,
wherein said light-emitting diode further comprises an ohmic contact layer disposed between said semiconductor epitaxy stack and said reflection layer, and said second pad electrode is electrically connected to said second type semiconductor layer through said ohmic contact layer.

2. The light-emitting diode as claimed in claim 1, wherein an upper surface of said first pad electrode is flush with an upper surface of said second pad electrode.

3. The light-emitting diode as claimed in claim 1, further comprising a light-transmissive dielectric layer disposed between said ohmic contact layer and said semiconductor epitaxy stack, and having a through hole, said ohmic contact layer filling said through hole to be in contact with said second type semiconductor layer.

4. The light-emitting diode as claimed in claim 3, further comprising an etch stop layer disposed between said ohmic contact layer and said second pad electrode, said second pad electrode being electrically connected to said second type semiconductor layer through said etch stop layer and said ohmic contact layer.

5. The light-emitting diode as claimed in claim 4, wherein said etch stop layer is made of one of platinum (Pt), titanium (Ti), nickel (Ni), chromium (Cr), gold (Au), and combinations thereof.

6. The light-emitting diode as claimed in claim 4, wherein said etch stop layer has a thickness ranging from 1000 Å to 5000 Å.

7. The light-emitting diode as claimed in claim 1, wherein said ohmic contact layer is made of one of a transparent conducting material, a conductive metal, and a combination thereof.

8. The light-emitting diode as claimed in claim 1, further comprising a substrate disposed on said reflection layer opposite to said semiconductor epitaxy stack.

9. The light-emitting diode as claimed in claim 1, further comprising a first contact electrode disposed between said first pad electrode and said first type semiconductor layer and extending from said electrode region onto said light exit region.

10. The light-emitting diode as claimed in claim 8, wherein said first type semiconductor layer has a roughened upper surface that faces away from said active layer.

11. The light-emitting diode as claimed in claim 8, further comprising a bonding layer disposed between said substrate and said semiconductor epitaxy stack.

12. The light-emitting diode as claimed in claim 11, wherein said bonding layer is made of one of a metallic material and an insulating material.

13. The light-emitting diode as claimed in claim 8, wherein said substrate is one of a conductive substrate and a non-conductive substrate.

14. The light-emitting diode as claimed in claim 1, wherein a total area of projections of said first pad electrode and said second pad electrode on an imaginary plane parallel to said second surface occupies 15% to 50% of an area of a projection of said light-emitting diode on said imaginary plane.

15. The light-emitting diode as claimed in claim 1, which emits light having an emission wavelength that ranges from 550 nm to 950 nm.

16. A light-emitting diode package, comprising:

a mounting substrate; and at least one of light-emitting diode as claimed in claim 1.

17. The light-emitting diode package as claimed in claim 16, wherein said mounting substrate is light-transmissive.

18. The light-emitting diode package as claimed in claim 16, wherein said first pad electrode and said second pad electrode are connected to said mounting substrate through soldering.

19. A light-emitting device, comprising a light-emitting diode as claimed in claim 1.

20. A light-emitting diode, comprising:

a semiconductor epitaxy stack having a first surface and a second surface opposite to said first surface, said first surface having an electrode region and a light exit region, said semiconductor epitaxy stack including a first type semiconductor layer, an active layer and a second type semiconductor layer that are arranged in such order in a direction from said first surface to said second surface;

a reflection layer disposed on said second surface opposite to said first surface;

a first pad electrode disposed on said electrode region and electrically connected to said first type semiconductor layer;

a second pad electrode disposed on said electrode region and electrically connected to said second type semiconductor layer;

a substrate disposed on said reflection layer opposite to said semiconductor epitaxy stack; and a bonding layer disposed between said substrate and said semiconductor epitaxy stack, and being made of one of a metallic material and an insulating material.

\* \* \* \* \*